US008580157B2

(12) United States Patent
Fukano et al.

(10) Patent No.: US 8,580,157 B2

(45) Date of Patent: Nov. 12, 2013

(54) SULFIDE AND PHOTOELECTRIC ELEMENT

(75) Inventors: Tatsuo Fukano, Nagoya (JP); Tomoyoshi Motohiro, Seto (JP); Hironori Katagiri, Nagaoka (JP)

(73) Assignees: Kabushiki Kaisha Toyota Chuo Kenkyusho, Aichi (JP); Institute of National Colleges of Technology, Japan, Tokyo (JP)

( * ) Notice: Subject to any disclaimer, the term of this patent is extended or adjusted under 35 U.S.C. 154(b) by 210 days.

(21) Appl. No.: 13/148,549

(22) PCT Filed: Feb. 16, 2010

(86) PCT No.: PCT/JP2010/052242

§ 371 (c)(1), (2), (4) Date: Aug. 9, 2011

(87) PCT Pub. No.: WO2010/095608

PCT Pub. Date: Aug. 26, 2010

(65) Prior Publication Data

US 2011/0303879 A1 Dec. 15, 2011

(30) Foreign Application Priority Data

Feb. 20, 2009 (JP) ................................ 2009-038510

(51) Int. Cl.
*H01B 1/02* (2006.01)

(52) U.S. Cl.
USPC ................ 252/519.51; 252/501.1; 252/520.1; 136/252

(58) Field of Classification Search
USPC ................ 252/501.1, 519.51, 520.1; 136/252
See application file for complete search history.

(56) References Cited

FOREIGN PATENT DOCUMENTS

| | | |
|---|---|---|
| JP | A-2007-18891 | 1/2007 |
| JP | A-2007-269589 | 10/2007 |
| JP | A-2007-284309 | 11/2007 |
| JP | A-2009-26891 | 2/2009 |
| WO | WO 2007/134843 A2 | 11/2007 |

OTHER PUBLICATIONS

Sep. 11, 2012 Japanese Office Action issued in Japanese Patent Application No. 2010-032837 (with translation).

Dec. 11, 2012 Office Action issued in Japanese Patent Application No. 2010-032837 (with translation).

Jimbo, K. et al., "$Cu_2ZnSnS_4$-type thin film solar cells using abundant materials," *Thin Solid Films*, 2007, pp. 5997-5999, vol. 515.

Katagiri, H., "$Cu_2ZnSnS_4$ thin film solar cells," *Thin Solid Films*, 2005, pp. 426-432, vol. 480-481.

(Continued)

*Primary Examiner* — Khanh Tuan Nguyen

(74) *Attorney, Agent, or Firm* — Oliff & Berridge, PLC

(57) ABSTRACT

The sulfide has the following composition, and the photoelectric element uses the sulfide. (1) The sulfide contains Cu, Zn, and Sn as a principal component. (2) When x is a ratio of Cu/(Zn+Sn), y is a ratio of Zn/Sn (x and y being atomic ratios), and the composition of the sulfide is represented by the (x, y) coordinates, with the points A=(0.78, 1.32), B=(0.86, 1.32), C=(0.86, 1.28), D=(0.90, 1.23), E=(0.90, 1.18), and F=(0.78, 1.28), the composition (x, y) of the sulfide is on any one of respective straight lines connecting the points A→B→C→D→E→F→A in that order, or within an area enclosed by the respective straight lines.

5 Claims, 4 Drawing Sheets

(56) References Cited

OTHER PUBLICATIONS

Moriya, K. et al., "Evaluation of thin film solar cells based on $Cu_2ZnSnS_4$ thin film prepared by sulfurization of evaporated Precursors," *Technical Report of IEICE*, Nov. 2002, pp. 53-58 (with abstract).
Kimura, R. et al., "CZTS Thin Film Solar Cells Using Co-sputtered Precursors," *IEICE Technical Report*, Nov. 2005, pp. 7-13, vol. 105, No. 393 (with abstract).
Katagiri, H. et al., "Preparation and evaluation of $Cu_2ZnSnS_4$ thin films by sulfurization of E-B evaporated precursors," *Solar Energy Materials and Solar Cells*, 1997, pp. 407-414, vol. 49.
International Search Report issued in International Application No. PCT/JP2010/052242 on Apr. 6, 2010 (with translation).
Written Opinion of the International Searching Authority issued in International Application No. PCT/JP2010/052242 on Apr. 6, 2010 (with translation).
International Preliminary Report on Patentability issued in International Application No. PCT/JP2010/052242 on Apr. 11, 2010 (with translation).

SULFIDE AND PHOTOELECTRIC ELEMENT

TECHNICAL FIELD

The present invention relates to a sulfide and a photoelectric element, and more specifically, to a sulfide suitable as material for photoelectric elements, such as a thin film solar cell, a photoconductive cell, a photodiode, a phototransistor, and a sensitized solar cell, and to a photoelectric element using the same.

BACKGROUND ART

A photoelectric element is an element that can convert energy of photons into an electric signal via some physical phenomenon (photoelectric conversion). A solar cell is a kind of the photoelectric elements, and can effectively convert light energy of sunlight into electrical energy.

Known semiconductors to be used in the solar cells include single-crystal Si, polycrystalline Si, amorphous Si, GaAs, InP, CdTe, $CuIn_{1-x}Ga_xSe_2$ (CIGS), $Cu_2ZnSnS_4$(CZTS), and the like.

Among them, chalcogenide compounds, typified by CIGS or CZTS, have a large optical absorption coefficient, and thus enable formation of a thin film which is advantageous for reduction in cost. In particular, solar cells using CIGS in a light-absorbing layer show the highest conversion efficiency among thin film solar cells, and obtain excellent conversion efficiency as compared to solar cells using polycrystalline Si. The CIGS, however, has the problems of inclusion of environmental load elements and rare elements.

In contrast, CZTS has band gap energy appropriate for solar cells (of about 1.4 to 1.5 eV) free from environmental load elements and rare elements. Solar cells using the CZTS in a light-absorbing layer, however, have low conversion efficiency as compared to solar cells using a conventional semiconductor in a light-absorbing layer.

Various proposals have hitherto been made to solve the forgoing problems.

For example, a non-patent document 1 discloses a manufacturing method of a CZTS-type solar cell which involves:

(1) placing a Mo-coated soda lime glass (SLG) substrate in a vacuum chamber, and fabricating a precursor film on the substrate by co-sputtering using ZnS, SnS, and Cu as a target, and (2) then transferring the substrate to an anneal chamber, introducing $N_2$+$H_2S$ (20%) reaction gas into the anneal chamber, and annealing the substrate at 580° C. for three hours.

This document describes the following:

(a) when sputter powers are set to 160 W for ZnS, 100 W for SnS, and 95 W for Cu, a CZTS film is obtained which has a ratio of Zn/Sn=1.18, and a ratio of Cu/(Zn+Sn)=0.94, without a dependence on the thickness of the CZTS film; and (b) when the Cu target power is decreased to 89 W, the film is obtained which has an open circuit voltage $V_{oc}$=662 mV, a short circuit current density $I_{sc}$=15.7 mA/$cm^2$, a fill factor F.F.=0.55, a conversion efficiency=5.74%, a series resistance $R_s$=9.04Ω, a parallel resistance $R_p$=612Ω, Cu/(Zn+Sn) ratio=0.87, and Zn/Sn ratio=1.15.

A non-patent document 2 discloses a manufacturing method of a CZTS-type solar cell which involves:

(1) depositing a Cu/Sn/ZnS stacked precursor or a Sn/Cu/ZnS stacked precursor on a Mo-coated SLG substrate by using electron-beam evaporation technique, and (2) sulfurizing the precursor in an atmosphere of $H_2S$ (5%)+$N_2$.

This document describes the following:

(a) When the Cu/Sn/ZnS stacked precursor is formed on the substrate, the surface of a thin film obtained after the sulfurization is rough and many voids are found therein. In contrast, when the Sn/Cu/ZnS stacked precursor is formed on the substrate, no large voids are found on the surface of a thin film obtained after the sulfurization.

(b) When the Cu/Sn/ZnS stacked precursor provided by stacking a ZnS layer of 330 nm in thickness, a Sn layer of 150 nm in thickness, and a Cu layer of 110 nm in thickness in that order over the substrate is sulfurized at 550° C., the film is obtained which has an open circuit voltage $V_{oc}$=621 mV, a short circuit current density $I_{sc}$=10.33 mA/$cm^2$, a fill factor F.F.=0.55, a conversion efficiency=3.50%, a series resistance Rs=8.7Ω, a parallel resistance $R_{sh}$=302 n, Cu/(Zn+Sn) ratio=0.85, and Zn/Sn ratio=1.19.

(c) When the Sn/Cu/ZnS stacked precursor provided by stacking a ZnS layer of 340 nm in thickness, a Cu layer of 120 nm in thickness, and a Sn layer of 160 nm in thickness in that order over the substrate is sulfurized at 520° C., the film is obtained which has an open circuit voltage $V_{oc}$=629 mV, a short circuit current density $I_s$=12.53 mA/$cm^2$, a fill factor F.F.=0.58, a conversion efficiency=4.53%, a series resistance $R_s$=8.5 0, a parallel resistance $R_{sh}$=428Ω, Cu/(Zn+Sn) ratio=0.85, and Zn/Sn ratio 1.03.

Further, a non-patent document 3 discloses a CZTS-based sulfide having a Cu/(Zn+Sn) ratio=0.96 and a Zn/Sn ratio=1.08.

CITATION LIST

Non Patent Literature

[Non-Patent Literature 1] Kazuo Jimbo et al., "$Cu_2ZnSnS_4$-type thin film solar cells using abundant materials", Thin Solid Films 515 (2007)5997-5999

[Non-Patent Literature 2] Hironori Katairi "$Cu_2ZnSnS_4$ thin film solar cells", Thin Solid Films 480-481 (2005)426-432

[Non-Patent Literature 3] TECHNICAL REPORT OF IEICE. CPM2002-121(2002-11), Shingaku Giho

SUMMARY OF INVENTION

Technical Problem

In general, it is required that the properties for a light-absorbing layer used in a photoelectric element, including a solar cell, have not only high conversion efficiency, but also high open circuit voltage $V_{oc}$, high short circuit current density $I_{sc}$, high fill factor F.F., and the like. The better the balance between these properties, the higher the performance of the photoelectric element.

Most of the CZTS solar cells known in the art, however, have low conversion efficiency. Even in a CZTS solar cell having the relatively high conversion efficiency, other properties except for the conversion efficiency are at low level, and hence a balance between the properties is bad.

Accordingly, it is an object of the present invention to provide a sulfide having relatively high properties of conversion efficiency, open circuit voltage, short circuit current density, fill factor, and the like, and having good balance between these properties, and also to provide a photoelectric element using the sulfide.

Solution to Problem

In order to solve the forgoing problems, a sulfide according to the invention has the following composition.

(1) The sulfide contains Cu, Zn, and Sn as a principal component.

(2) When x is a ratio of Cu/(Zn+Sn), y is a ratio of Zn/Sn (x and y being atomic ratios), and a composition of the sulfide is represented by the (x, y) coordinates, with the points A=(0.78, 1.32), B=(0.86, 1.32), C=(0.86, 1.28), D=(0.90, 1.23), E=(0.90, 1.18), and F=(0.78, 1.28), the composition (x, y) of the sulfide is on anyone of respective straight lines connecting the points A→B→C→D→E→F→A in that order, or within an area enclosed by the respective straight lines.

Further, a photoelectric element according to the invention uses the sulfide of the invention.

Advantageous Effects of Invention

In the sulfide containing Cu, Zn, and Sn as a principal component, the atomic ratios of Cu, Zn, and Sn are optimized such that the Cu/(Zn+Sn) ratio and the Zn/Sn ratio are in a certain range, which can provide the sulfide with not only high conversion efficiency, but also high open circuit voltage $V_{oc}$, short circuit current density $I_{sc}$, and fill factor F.F. The use of such a sulfide in the light-absorbing layer of the thin film solar cell, or in the photosensitizer of the sensitized solar cell can provide the photoelectric element with high properties and with good balance between these properties.

DESCRIPTION OF EMBODIMENTS

Figure 1:
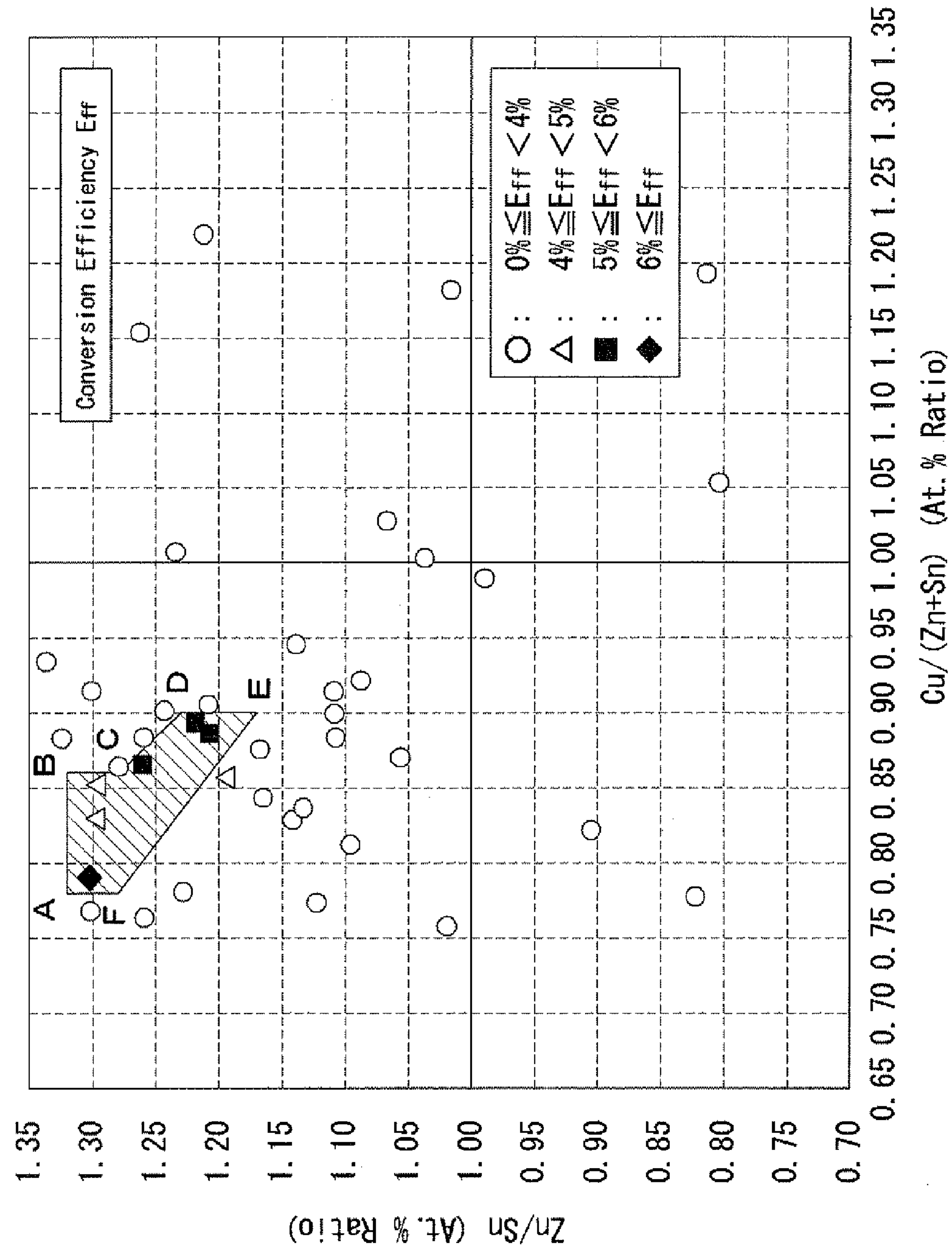
FIG. 1 is a diagram showing a relationship between the Cu/(Zn+Sn) ratio (as x value) and the Zn/Sn ratio (as y value) of a CZTS, and the conversion efficiency ($E_{ff}$) of the CZTS.

One embodiment of the invention will now be described in detail.

[1. Sulfide]

A sulfide according to the invention includes the following composition:

(1) The sulfide contains Cu, Zn, and Sn as a principal component.

(2) When x is a ratio of Cu/(Zn+Sn), y is a ratio of Zn/Sn (x and y being atomic ratios), and the composition of the sulfide is represented by the (x, y) coordinates, with the points A=(0.78, 1.32), B=(0.86, 1.32), C=(0.86, 1.28), D=(0.90, 1.23), E (0.90, 1.18), and F=(0.78, 1.28), the composition (x, y) of the sulfide is on any one of respective straight lines connecting the points A→B→C→D→E→F→A in that order, or within an area enclosed by the respective straight lines.

[1.1 Component]

The term "sulfide containing Cu, Zn, and Sn as a principal component" as used herein means a $Cu_2ZnSnS_4$(CZTS)-based compound. The CSTS is a semiconductor having a band gap of about 1.45 eV, and an optical absorption coefficiency of $10^4$ $cm^{-1}$ or more. The CZTS having a stoicheiometric composition has low conversion efficiency, but a CZTS whose Cu content is slightly decreased as compared to the stoicheiometric composition shows relatively high conversion efficiency. The "sulfide containing Cu, Zn, and Sn as a principal component" in the invention contains not only a compound having the stoicheiometric composition but also all nonstoichiometric compounds exhibiting relatively high conversion efficiencies, or all compounds containing Cu, Zn, Sn, and S as a principal component.

The sulfide may be composed of only Cu, Zn, Sn, and S. Alternatively, in addition to the above elements, the sulfide may further contain various kinds of dopants, inevitable impurities, and the like.

[1.2 Compositions]

When x is a ratio of Cu/(Zn+Sn), y is a ratio of Zn/Sn (x and y being atomic ratios), and the composition of the sulfide is represented by the (x, y) coordinates, with the points A=(0.78, 1.32), B=(0.86, 1.32), C=(0.86, 1.28), D=(0.90, 1.23), E=(0.90, 1.18), and F=(0.78, 1.28), the composition (x, y) of the sulfide according to the invention is on any one of respective straight lines connecting the points A→B→C→D→E→F→A in that order, or within an area enclosed by the respective straight lines. If the composition (x, y) of the sulfide is outside the above-mentioned area, one or more of the conversion efficiency, the open circuit voltage $V_{oc}$, the short circuit current density $I_{sc}$, and the fill factor F.F. will be reduced, and thus the balance between these properties will deteriorate.

[2. Fabricating Method of Sulfide]

The sulfide of the invention can be fabricated by the following methods, specifically:

(1) a method which involves forming a Cu—Zn—Sn or Cu—Zn—Sn—S precursor film on the surface of a substrate by sputtering or the like, and applying heat treatment to the precursor film in an atmosphere of hydrogen sulfide or vaporized sulfur;

(2) a method of sol-gel process and sulfurization which involves coating a substrate with a solution dissolving therein an organic metal or the like, drying the substrate in air to cause hydrolysis and condensation polymerization, thereby forming a metal oxide thin film containing Cu, Zn, and Sn, and applying heat treatment to the metal oxide thin film in an atmosphere of hydrogen sulfide or vaporized sulfur;

(3) a method which involves forming a thin film composed of the sulfide of the invention on the surface of a substrate by various ways, and scraping the thin film off the substrate to obtain powder;

(4) a method which involves mixing two or more kinds of sulfides containing one or more kinds of Cu, Zn, and Sn, and performing a solid phase reaction of the mixture;

(5) a method which involves mixing two or more kinds of metal powder containing one or more kind of Cu, Zn, and Sn at a predetermined ratio, and sulfurizing the mixed powder by sulfur sources (for example, hydrogen sulfide, vaporized sulfur, sulfur powder, and the like);

(6) a method which involves spraying a solution dissolving therein a metal salt or metal sulfide containing Cu, Zn, and Sn on a substrate heated;

(7) a method which involves spraying a solution dissolving therein a metal salt or metal sulfide containing Cu, Zn, and Sn, into a high temperature atmosphere;

(8) a method which involves spraying a solution dissolving therein a metal salt or metal sulfide on a substrate heated to form a Cu—Zn—Sn—S precursor film, and then applying heat treatment to the precursor film in an atmosphere of hydrogen sulfide or vaporized sulfur; and (9) a method which involves spraying a solution dissolving therein a metal salt or metal sulfide in a high-temperature atmosphere to form a Cu—Zn—Sn—S precursor, and then applying heat treatment to the precursor in an atmosphere of hydrogen sulfide or vaporized sulfur.

(10) a method which involves forming a raw material such as a metal or metal sulfide containing Cu, Zn and Sn, on a heated substrate, by sputtering or the like.

(11) a method which involves forming a raw material such as a metal or metal sulfide containing Cu, Zn and Sn, further adding a raw material of S, on a heated substrate, by sputtering or the like.

(12) a method which involves forming a raw material such as a metal or metal sulfide containing Cu, Zn and Sn, on a heated substrate, by sputtering or the like, and then applying heat treatment to the substrate in an atmosphere of hydrogen sulfide or vaporized sulfur.

(13) a method which involves forming a raw material such as a metal or metal sulfide containing Cu, Zn and Sn, further adding a raw material of S, on a heated substrate, by sputtering or the like, and then applying heat treatment to the substrate in an atmosphere of hydrogen sulfide or vaporized sulfur.

The fabricating of sulfide is preferably performed under coexistence with Na. When the sulfide is fabricated under the coexistence with Na, the conversion efficiency of the sulfide is improved. This is because Na promotes grain growth of the sulfide.

The term "fabricating of the sulfide under coexistence with Na" means existence of Na around the sulfide or a precursor of the sulfide during synthesis of the sulfide, or during grain growth thereof.

Methods for fabricating a sulfide under coexistence with Na include, specifically:

(1) a method which involves, when forming a thin film composed of sulfide on a substrate, preparing the substrate containing Na (for example, SLG) for use, and diffusing Na of the substrate into the thin film during heat treatment for making the sulfide;

(2) a method which involves, when forming a thin film composed of a precursor of a sulfide on a substrate and sulfurizing the precursor thin film, performing one of steps (a) to (c), that is, (a) evaporating a Na-containing compound (for example, $Na_2S$) onto the surface of the precursor thin film, (b) spraying a solution dissolving a Na-containing compound onto the surface of the precursor thin film to react the precursor thin film with the solution dissolving the Na-containing compound, or (c) implanting Na ions into the precursor thin film;

(3) a method which involves, after forming a thin film composed of a sulfide on a substrate, performing one of steps (a) to (c), that is, (a) evaporating a Na-containing compound (for example, $Na_2S$) onto the surface of the thin film, (b) spraying a solution dissolving a Na-containing compound onto the surface of the thin film to react the thin film with the solution dissolving the Na-containing compound, or (C) implanting Na ions into the thin film, and then applying heat treatment to the thin film;

(4) a method which involves adding a Na-containing compound (for example, $Na_2S$) into a raw material mixture when performing a solid phase reaction of two or more kinds of sulfides, or when sulfurizing metal powder;

(5) a method which involves adding a Na-containing compound (for example, $Na_sS$) to a raw material in sputtering or the like; and (6) a method which involves, when using a solution dissolving therein organic metal, metal salt, or metal sulfide, adding a Na-containing compound (for example, $Na_2S$) to the solution.

In a case where the sulfide is fabricated under coexistence with Na, the sulfide is preferably cleaned with polar solvent after being fabricated. Synthesis of the sulfide under coexistence with Na causes the crystalline grain to grow due to Na, but Na itself is hardly solid-soluble in the sulfide. Thus, Na remains on the surface or inside of the sulfide after the synthesis reaction. It seems that the remaining Na is bonded with oxygen in the atmosphere to form Na—O based particles. The Na—O based particles produced are insulating material, and thus cause the reduction in conversion efficiency of the sulfide. The cleaning process with the polar solvent is to remove the Na—O based particles.

The polar solvents which can dissolve the Na—O based particles include, specifically:

(1) water, (2) an inorganic acid such as hydrochloric acid, nitric acid, or sulfuric acid, or an aqueous solution thereof, (3) an organic acid such as formic acid, acetic acid, or citric acid, or an aqueous solution thereof, (4) a base such as sodium hydroxide, or ammonia, or an aqueous solution thereof, (5) a polar organic solvent such as methanol, ethanol, isopropyl alcohol, acetonitrile, acetone, N,N-dimethylformamide, or dimethylsulfoxide, and (6) a mixture of two or more solvents shown in the above items (1) to (5).

In particular, water does not pollute environment, is harmless to the human body, and thus is suitable as a solvent for cleaning.

A cleaning method is not limited to a specific one, and various methods can be used for cleaning. For example, the known cleaning methods, including rinsing, cleaning with flowing water, spray cleaning, ultrasonic cleaning, and the like, can be used. Heating upon cleaning is effective.

[3. Photoelectric Element and Manufacturing Method Thereof]

A photoelectric element according to the invention uses the sulfide of the invention.

The photoelectric elements in the invention include, specifically:

(1) a thin film solar cell using the sulfide of the invention as a light-absorbing layer;

(2) a sensitized solar cell using the sulfide of the invention as a photosensitizer; and (3) a photoconductive cell, a photodiode, or a phototransistor using the sulfide of the invention in a light receiving portion.

[3.1 Thin Film Solar Cell]

For example, thin film solar cells generally include a structure formed by stacking a substrate, a lower electrode, a light-absorbing layer, a buffer layer, a window layer, and an upper electrode in that order. An additional layer (for example, an adhesion layer, a light-scattering layer, an anti-reflection layer, and the like) may be formed between the above respective layers. The sulfide of the invention is used for the light-absorbing layer. A material for each layer other than the light-absorbing layer is not limited to a specific one, and various kinds of materials can be used therefor according to the purpose of use.

The substrate is to support various kinds of thin films to be formed thereon.

Materials for the substrate include, for example:

(1) glass such as a SLG, a low-alkali glass, a non-alkali glass, a quartz glass, a quartz glass with Na ions implanted thereinto, or a sapphire glass;

(2) an oxide such as a silica, an alumina, an yttria, or a zirconia, and various kinds of ceramic containing Na; and (3) metal such as stainless steel, stainless steel containing Na, Au, Mo, or Ti.

In particular, the use of material containing Na such as a SLG, a quartz glass with Na ions implanted thereinto, ceramic containing Na, or stainless steel containing Na, as the substrate advantageously provides the light-absorbing layer with high conversion efficiency.

The lower electrode is to improve adhesion between the substrate and the light-absorbing layer and to take current generated in the light-absorbing layer. The lower electrode is made of a material with high electric conductivity and good adhesion to the substrate.

Materials suitable for the lower electrode include, for example, Mo, $MoSi_2$, stainless steel, In—Sn—O, In—Zn—O, ZnO:Al, ZnO:B, $SnO_2$:F, $SnO_2$:Sb, ZnO:Ga, $TiO_2$:Nb, and the like. Especially, Mo is preferable as the material for the lower electrode because it has high adhesion to glass. In use of a conductive material (for example, a metal substrate) for the substrate, the current can be taken via the substrate. Thus, in such a case, the lower electrode does not necessarily have to be formed.

The buffer layer is to make connection between the light-absorbing layer and the window layer better thereby to improve the conversion efficiency. Semiconductors with high electric resistance for allowing most of light from visible light to near-infrared light to pass therethrough are used as the buffer layer.

Materials for the buffer layer include, for example, CdS, ZnO, $SnO_2$, Zn(O, OH), ZnS, Zn(O, S), $Zn(O, S, OH)_x$, $Zn_{1-x}Mg_xO$, In—S, and the like. Among them, especially, CdS is preferable as the buffer layer.

The window layer is to allow light to reach the light-absorbing layer, while taking current at the same time. Semiconductors with low electric resistance for allowing most of light from visible light to near-infrared light to pass therethrough are used as the window layer.

When the light-absorbing layer is made of CZTS, materials for the window layer include, for example, ZnO:Al, ZnO:Ga, ZnO:B, In—Sn—O, In—Zn—O, $SnO_2$:Sb, $TiO_2$:Nb, and the like. Among them, especially, ZnO:Al is preferable as the window layer.

The upper electrode is to effectively take current collected by the window layer to the outside. The upper electrode is normally formed in a comb shape because it needs to allow the light to reach the light-absorbing layer.

Materials for the upper electrode include, for example, Al, Cu, Ag, Au, and an alloy containing one or more of the above metals. Such alloys include, specifically, Al—Ti alloy, Al—Mg alloy, Al—Ni alloy, Cu—Ti alloy, Cu—Sn alloy, Cu—Zn alloy, Cu—Au alloy, Ag—Ti alloy, Ag—Sn alloy, Ag—Zn alloy, Ag—Au alloy, and the like.

The adhesion layer is to enhance the adhesion between the substrate and the lower electrode, and can be formed as needed. For example, when a glass substrate is used as the substrate and Mo is used as the lower electrode, the adhesion layer in use is preferably Ti, Cr, Ni, W, or an alloy containing one or more of these elements.

The light-scattering layer is to reflect incident light, thereby enhancing light absorption efficiency at the light-absorbing layer, and can be formed as needed. One light-scattering layer is provided on the upper electrode side with respect to the light-absorbing layer. The other light-scattering layer is provided on the substrate side with respect to the light-absorbing layer.

The light scattering layer provided on the upper electrode side with respect to the light-absorbing layer in use is preferably an aggregate composed of transparent particles, an aggregate composed of two or more kinds of particles with different refractive indexes, a member having a surface with concavities and convexities, a member having a space therein, or the like. The light scattering layer provided above the light-absorbing layer is preferably formed of a material for allowing most of light from visible light to near-infrared light to pass therethrough, specifically, an oxide such as $SiO_2$, or $TiO_2$, or a nitride such as Si—N.

In contrast, the other light scattering layer provided on the substrate side with respect to the light-absorbing layer in use is preferably, for example, a member having a surface with concavities and convexities. The light-scattering layer provided under the light-absorbing layer does not necessarily have to be a material for allowing light to pass therethrough. It is noted that the same kind of light scattering function can be provided by processing the surface of the substrate or the like.

The antireflection layer is to reduce the amount of incident light reflected from the window layer, and to enhance the light absorption efficiency at the light-absorbing layer, and can be formed as needed. The antireflection layer in use is preferably, for example, a transparent member whose refractive index is smaller than that of the window layer, an aggregate including transparent particles having a sufficiently smaller diameter than the wavelength of sunlight, or a member having therein a space with a sufficiently smaller diameter than the wavelength of sunlight. Specifically, the antireflection layer in use preferably includes:

(1) a thin film made of $MgF_2$, $SiO_2$, or the like;

(2) a multilayer film made of an oxide, a sulfide, a fluoride, a nitride, or the like; or (3) fine particles made of an oxide such as $SiO_2$.

Such a thin film solar cell can be manufactured by stacking the lower electrode, the light-absorbing layer, the buffer layer, the window layer, and the upper electrode over the surface of the substrate in that order. The forming method of each member is not limited to a specific one, and an optimal forming method of each member can be selected according to the material for each member.

The forming methods of each member include, for example, sputtering, vacuum deposition, pulsed laser deposition (PLD), plating, chemical bath deposition (CBD), electrophoretic deposition (EPD), chemical vapor deposition (CVD), spray pyrolysis deposition (SPD), screen printing, spin coating, fine particle deposition, and the like.

In use of CdS as the material for the buffer layer, the CdS layer can be formed by a chemical bath deposition technique (CBD method) which involves dissolving thiourea or the like into an aqueous solution containing metal ions, immersing a substrate in the solution, and heating the substrate.

[3.2 Sensitized Solar Cell]

A sensitized solar cell generally includes a first substrate having a first transparent electrode, an n-type semiconductor layer, and a light sensitized agent formed thereover in that order, and a second substrate having a second transparent electrode formed thereover. The first substrate and the second substrate are opposed to each other while the respective sides of the substrates with the transparent electrodes formed thereon are directed inward, and an electrolyte is charged into a gap between the substrates. Materials for components other than the photosensitizer are not limited to a specific one, and various kinds of materials can be used according to the purpose of use.

The first and second substrates are to support components of the cell. The substrate needs to allow the light to reach the photosensitizer, and thus is formed of material that allows the visible light to pass therethrough.

Materials for the substrate include, for example, glass, ceramic, crystal, fluororesin, polyimide, polyamide, engineering plastic, oriented resin, and a stacked member of these materials.

The first and second transparent electrodes are to take current. The transparent electrode needs to allow the light to reach the photosensitizer, and thus is formed of material that allows the visible light to pass therethrough.

Materials for the transparent electrode include, for example, In—Sn—O, $SnO_2$:F, $SnO_2$:Sb, In—Zn—O, ZnO: Al, ZnO Ga, ZnO:B, $TiO_2$: Nb, and the like.

The n-type semiconductor layer is to receive electrons discharged from the photosensitizer and to supply the electrons to the first transparent electrode.

Materials for the n-type semiconductor layer include, for example, $TiO_2$, $SnO_2$, $ZnO_2$ $Nb_2O_5$, $Ta_2O_5$, $Ga_2O_3$, $Si_3N_4$, and the like.

The photosensitizer is to excite electrons by absorbing the light, and to supply the excited electrons to the n-type semiconductor layer. The photosensitizer having lost the electrons newly receives electrons from the electrolyte to be recycled.

In the invention, the sulfide according to the invention is used as the photosensitizer of the sensitized solar cell.

The electrolyte is to receive electrons from the second transparent electrode and to supply the received electrons to the photosensitizer.

Materials for the electrolyte include, for example, a solution-based electrolyte, a non-volatile solution-based electrolyte, and the like.

For example, the solution-based electrolyte includes one made by adding LiI, 1,2-dimethyl-3-propyl imidazolium iodide, iodine, or tertial-butyl-pyridine to an acetonitrile solvent.

The non-volatile solution-based electrolyte includes one made by adding 1-ethyl-3-methyl imidazolium iodide and iodine to 1-ethyl-3-methyl imidazolium bis-trifluoromethane sulfonimide.

Such a sensitized solar cell can be manufactured by the following steps of:

(1) forming first and second transparent electrodes on surfaces of first and second substrates, respectively, by the sputtering, vacuum deposition, CVD method, SPD method, PLD method, or the like, (2) forming a powder layer including an n-type semiconductor on the surface of the first transparent electrode by using a doctor blade method, a squeegee method, a spin coat method, a printing method, or the like, and heating the powder layer at a predetermined temperature (for example, 400 to 500° C.) thereby to bake the n-type semiconductor layer to the surface of the first transparent electrode, (3) forming a powder layer including a sulfide on the surface of the n-type semiconductor layer by using the doctor blade method, the squeegee method, the spin coat method, the printing method, a dip method, or the like, and heating the powder layer to a predetermined temperature thereby to bake a photosensitizer to the surface of the n-type semiconductor layer, and (4) opposing the first substrate with the first transparent electrode, the n-type semiconductor layer, and the photosensitizer formed thereon, to the second substrate with the second transparent electrode formed thereon, and charging an electrolyte into between both substrates.

[4. Effects of Sulfide and Photoelectric Element Using Same]

In the sulfide containing Cu, Zn, and Sn as principal components, the atomic ratios of Cu, Zn, and Sn are optimized such that the atomic ratios of Cu/(Zn+Sn) and Zn/Sn are in a certain range, which can provide the sulfide with not only high conversion efficiency but also high open circuit voltage $V_{oc}$, short circuit current density $I_{sc}$, and fill factor F.F. The use of such a sulfide in the light-absorbing layer of the thin film solar cell, or in the photosensitizer of the sensitized solar cell can provide the photoelectric element with high properties and with good balance between these properties.

EXAMPLES

1. Manufacture of Specimens

A solar cell was fabricated based on the following procedure:

(1) A Mo lower electrode layer (having a thickness of 1 μm or less) was deposited on a SLG substrate by the sputtering.

(2) Various types of Cu—Zn—Sn—S precursor films with different Cu/(Zn+Sn) ratios and Zn/Sn ratios were deposited over the respective Mo lower electrode layers by sputtering. Then, each precursor film was subjected to a sulfurization process under atmospheric pressure in an atmosphere of 5% $H_2S+N_2$ gas at 550 to 580° C. for 3 hours thereby to be transformed into a CZTS light-absorbing layer (having a thickness of 1.4 μm or less).

(3) A CdS buffer layer (having a thickness of 70 m or less) was formed over the CZTS film by the CBD method.

(4) An Al:ZnO window layer (having a thickness of 400 nm or less), and a comb-shaped Al upper electrode layer (having a thickness of 0.6 μm less) were deposited over the CdS buffer layer by sputtering in that order.

(5) An effective light receiving area of the solar cell manufactured was about 0.16 $cm^2$.

2. Test Method

[2.1 Compositions]

The composition of each CZTS light-absorbing layer was measured by fluorescent X-ray analysis (XRF). The ratio of Cu/(Zn+Sn) (atomic percent ratio, namely, at. % ratio) and the ratio of Zn/Sn (at. % ratio) were calculated from the obtained composition.

[2.2 Properties of Solar Cell]

The conversion efficiency ($E_{ff}$), the open circuit voltage ($V_{oc}$), the short circuit current density ($I_{sc}$), and the fill factor (F.F.) were evaluated using the solar cells manufactured.

Pseudo sunlight with air mass 1.5 (AM 1.5) was applied to the solar cell, immediately followed by measurement. The measurement was completed in several seconds.

3. Results

Figure 2:
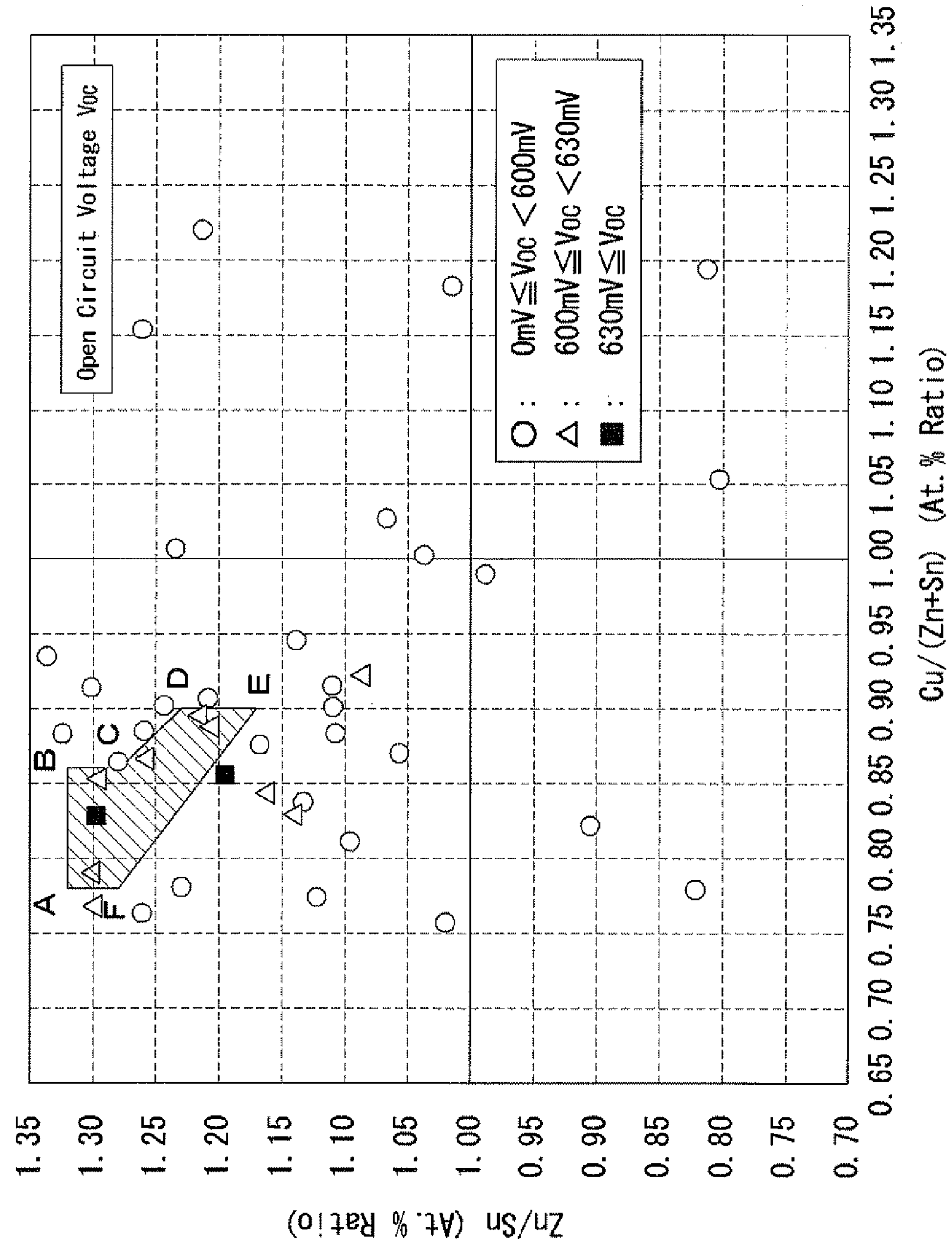
FIG. 2 is a diagram showing a relationship between the Cu/(Zn+Sn) ratio (as x value) and the Zn/Sn ratio (as y value) of the CZTS, and the open circuit voltage ($V_{oc}$) of the CZTS.
Figure 3:
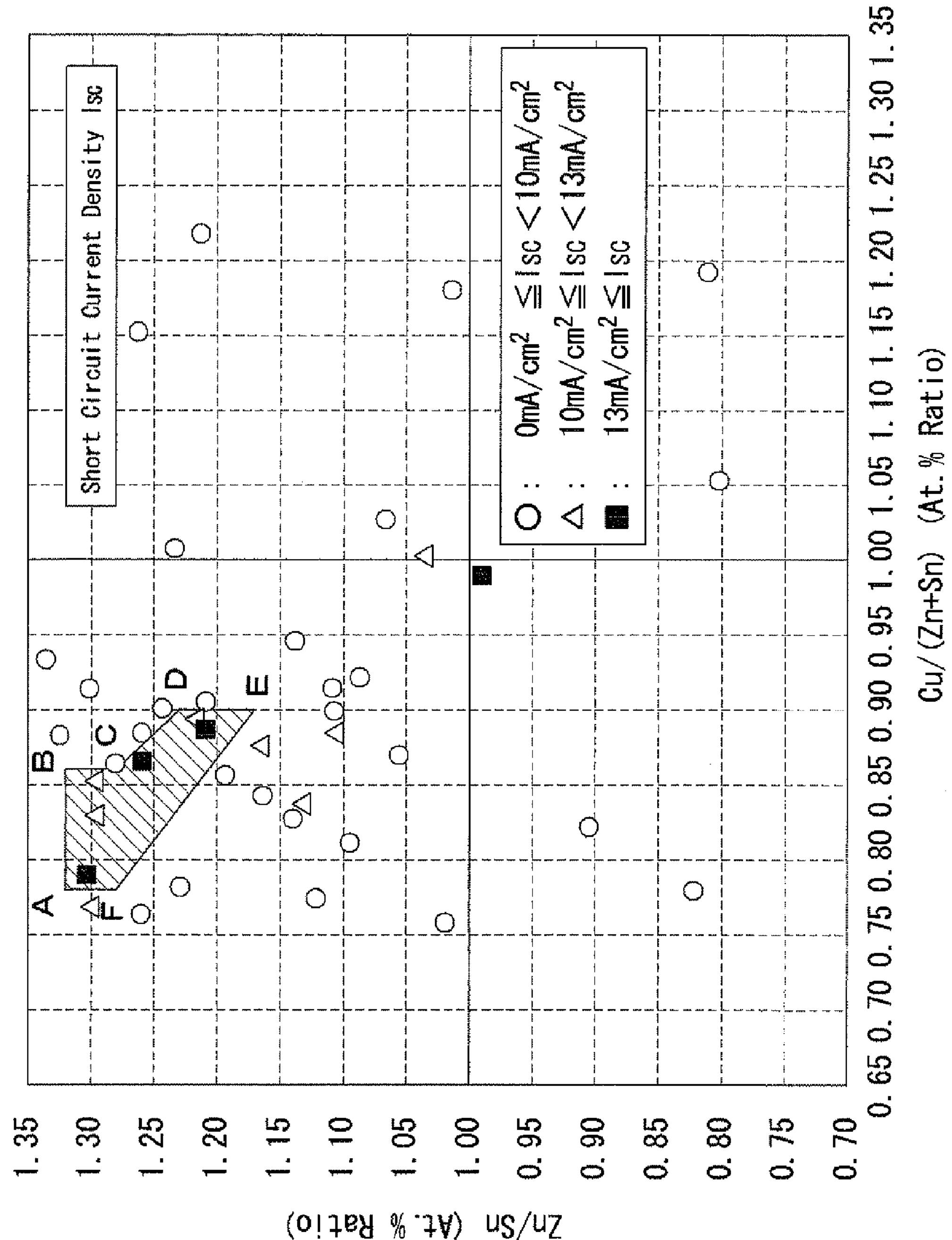
FIG. 3 is a diagram showing a relationship between the Cu/(Zn+Sn) ratio (as x value) and the Zn/Sn ratio (as y value) of the CZTS, and the short circuit current density ($I_{se}$) of the CZTS.
Figure 4:
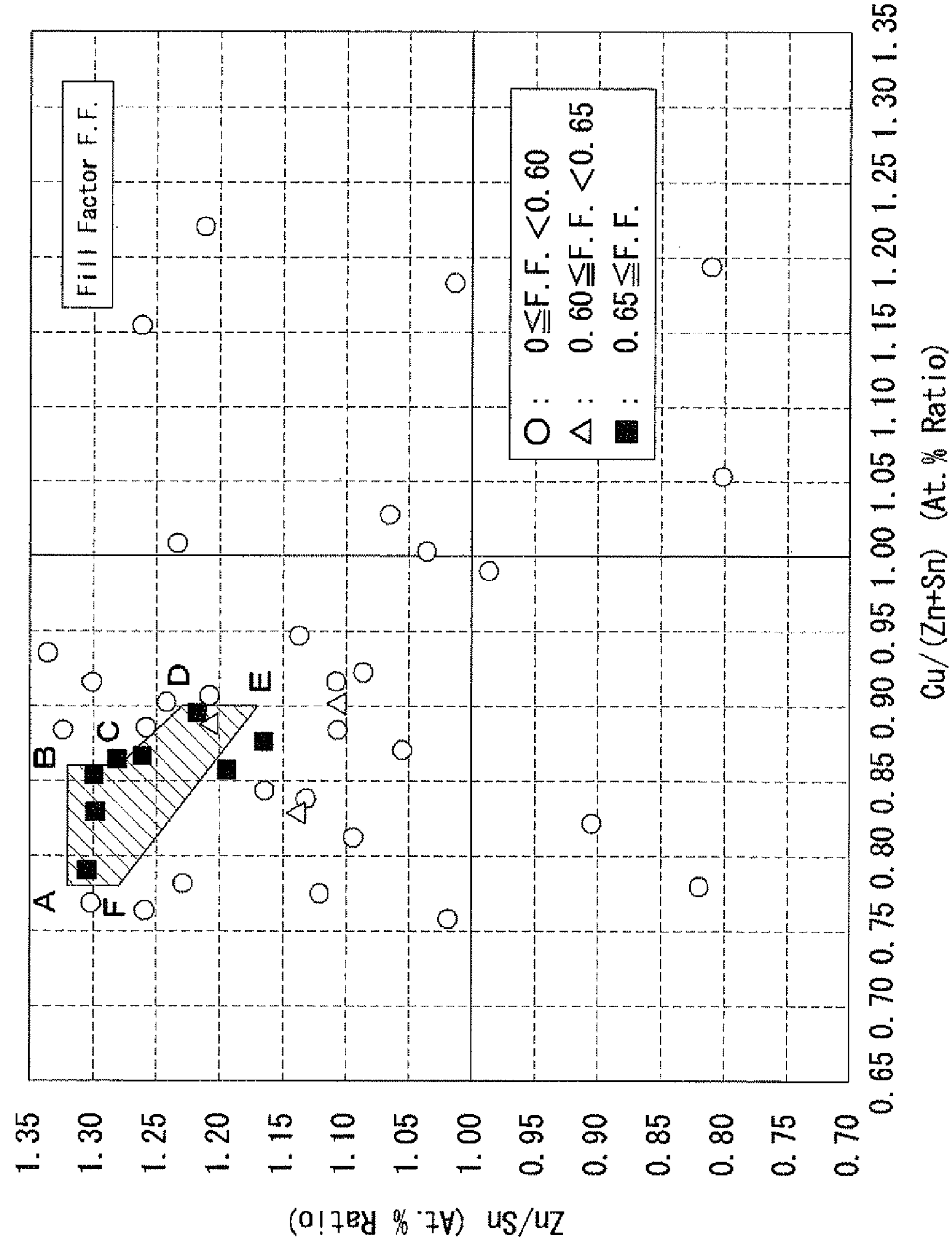
FIG. 4 is a diagram showing a relationship between the Cu/(Zn+Sn) ratio (as x value) and the Zn/Sn ratio (as y value) of the CZTS, and the fill factor (F.F.) of the CZTS.

The conversion efficiency ($E_{ff}$), the open circuit voltage ($V_{oc}$), the short circuit current density ($I_{sc}$), and the fill factor (F.F.) of each specimen were plotted with the Cu/(Zn Sn) ratio on the x-axis and the Zn/Sn ratio on the y-axis. FIGS. 1, 2, 3, and 4 show the conversion efficiency ($E_{ff}$), the open circuit voltage ($V_{oc}$), the short circuit current density ($I_{sc}$), and the fill factor (F. F.) of each of the specimens with different Cu/(Zn+Sn) ratios (as the x value) and Zn/Sn ratios (as the y value).

The conversion efficiency ($E_{ff}$), the open circuit voltage ($V_{oc}$), the short circuit current density ($I_{sc}$), and the fill factor (F.F.) satisfy the following relationship (1).

$$E_{ff}=V_{oc}\times I_{sc}\times F.F. \quad (1)$$

A boundary value of $V_o$, for determining good or bad of $V_{oc}$ was 600 mV. A boundary value of $I_{sc}$ for determining good or bad of $I_{sc}$ was 10 mA/$cm^2$. A boundary value of F.F. for determining good or bad of F.F. was 0.60. A boundary value of $E_{ff}$ for determining good or bad of $E_{ff}$ was 4.0%.

As can be seen from FIGS. 1 to 4, the composition (x, y) of the sulfide whose $E_{ff}$, $V_{oc}$, $I_{sc}$ and F.F. all are equal to or more than the respective boundary values for determining good or bad is on any one of respective straight lines connecting the points A→B→C→D→E→F→A in that order, or within an area enclosed by the respective straight lines with the points A=(0.78, 1.32), B=(0.86, 1.32), C=(0.86, 1.28), D=(0.90, 1.23), E=(0.90, 1.18), and F=(0.78, 1.28).

In general, it is known that in a solar cell using a compound semiconductor as a material for the light-absorbing layer, the smaller the effective light receiving area, the higher the conversion efficiency measured, while the longer the time from the application of the pseudo solarlight to the start of the measurement (about several tens minutes), the higher the conversion efficiency measured. The above-mentioned non-patent documents 1 to 3 do not disclose the conditions for the above fact.

In contrast, it is found that the composition according to the invention has good properties at a specific effective light receiving area even in measurement for a very short time.

The embodiments of the invention have been described above in detail. The invention is not limited to the disclosed embodiments, and various modifications can be made without departing from the scope of the invention.

INDUSTRIAL APPLICABILITY

The sulfide according to the invention can be used in various types of photoelectric elements, such as a thin film solar cell, a photoconductive cell, a photodiode, a phototransistor, or a sensitized solar cell.

The invention claimed is:

1. A sulfide comprising Cu, Zn, and Sn as a principal component, wherein, when x is a ratio of Cu/(Zn+Sn), y is a ratio of Zn/Sn, x and y being atomic ratios, and a composition of the sulfide is represented by the (x, y) coordinates, with points A=(0.78, 1.32), C=(0.86, 1.28), D=(0.90, 1.23), E=(0.90, 1.18), and F=(0.78, 1.28), the composition (x, y) of the sulfide is on any one of respective straight lines connecting the points A→C→D→E→F→A in that order, or within an area enclosed by the respective straight lines.

2. A method for manufacturing a sulfide according to claim 1, comprising:

forming various types of Cu—Zn—Sn—S precursor films on a substrate; and sulfurizing the precursor films in an atmosphere of hydrogen sulfide or vaporized sulfur.

3. A Solar cell, comprising:

an alkali glass substrate;

a Mo lower electrode layer formed on the alkali glass substrate;

a CZTS light-absorbing layer composed of the sulfide according to claim 1, formed on the Mo lower electrode layer;

a CdS buffer layer formed on the CZTS light-absorbing layer;

an Al:ZnO window layer formed on the CdS buffer layer; and a comb-shaped Al upper electrode layer formed on the Al:ZnO window layer.

4. A photoelectric element comprising the sulfide according to claim 1.

5. A photoelectric element comprising a sulfide as a light-absorbing layer that is the same as a sulfide according to claim 1, except that:

the composition (x, y) of the sulfide is on any one of respective straight lines connecting the points A→C→D→E→F→A in that order, or within an area enclosed by the respective straight lines; and satisfies the following properties (1) to (4):

(1) a conversion efficiency ($E_{ff}$)≥4.0%, (2) an open circuit voltage ($V_{oc}$)≥600 mV, (3) a short circuit current density ($I_{sc}$)≥10 mA/cm$^2$, and (4) a fill factor (F.F.)≥0.60.

* * * * *